United States Patent [19]

Kobashi et al.

[11] Patent Number: 5,523,160
[45] Date of Patent: Jun. 4, 1996

[54] HIGHLY-ORIENTED DIAMOND FILM

[75] Inventors: Koji Kobashi, Nishinomiya; Kozo Nishimura; Koichi Miyata, both of Kobe; Takeshi Tachibana, Osaka, all of Japan; Brian R. Stoner, Raleigh, N.C.

[73] Assignee: Kobe Steel USA, Inc., Research Triangle Park, N.C.

[21] Appl. No.: 466,922

[22] Filed: Jun. 6, 1995

Related U.S. Application Data

[63] Continuation of Ser. No. 62,005, May 14, 1993, abandoned.

[51] Int. Cl.$^6$ .................................................. H01L 41/08
[52] U.S. Cl. ...................... 428/408; 310/313 R; 428/688
[58] Field of Search .................................. 428/408, 446, 428/688; 310/313 R

[56] References Cited

U.S. PATENT DOCUMENTS

| | | | |
|---|---|---|---|
| 4,670,968 | 6/1987 | Mikami et al. | 29/576 B |
| 4,806,900 | 2/1989 | Fujimori et al. | 338/22 R |
| 4,863,529 | 9/1989 | Imai et al. | 148/33.4 |
| 5,066,938 | 11/1991 | Kobashi et al. | 338/22 SD |
| 5,086,014 | 2/1992 | Miyata et al. | 437/103 |
| 5,089,802 | 2/1992 | Yamazaki | 338/22 SD |
| 5,124,179 | 6/1992 | Garg et al. | 427/249 |
| 5,126,206 | 6/1992 | Garg et al. | 428/408 |
| 5,144,380 | 9/1992 | Kimoto et al. | 357/22 |
| 5,183,530 | 2/1993 | Yamazaki | 156/643 |

FOREIGN PATENT DOCUMENTS

| | | |
|---|---|---|
| 421397A1 | 4/1991 | European Pat. Off. . |
| 445998A1 | 9/1991 | European Pat. Off. . |
| 59-27754 | 2/1984 | Japan . |
| 59-137396 | 8/1984 | Japan . |
| 60-12747 | 1/1985 | Japan . |
| 61-3320 | 1/1986 | Japan . |
| 61-251158 | 11/1986 | Japan . |
| 64-55862 | 3/1989 | Japan . |
| 64-68966 | 3/1989 | Japan . |
| 1-158774 | 6/1989 | Japan . |
| 1-244399 | 9/1989 | Japan . |
| 2-273960 | 11/1990 | Japan . |
| 3-12966 | 1/1991 | Japan . |
| 3-94429 | 4/1991 | Japan . |
| 3-110866 | 5/1991 | Japan . |
| 3-120865 | 5/1991 | Japan . |
| 3-160731 | 7/1991 | Japan . |
| 3-263872 | 11/1991 | Japan . |
| 3-278463 | 12/1991 | Japan . |
| 3-278474 | 12/1991 | Japan . |
| 4-26161 | 1/1992 | Japan . |
| 4-26172 | 1/1992 | Japan . |
| 2243949 | 11/1991 | United Kingdom . |
| 2252202 | 7/1992 | United Kingdom . |

OTHER PUBLICATIONS

U.S. Patent Application Serial No. 07/811,425, filed Dec. 20, 1991, *Nucleation Enhancement for Chemical Vapor Deposition of Diamond*, Stoner et al., now abandoned.

U.S. Patent Application Serial No. 07/937,481, filed Aug. 28, 1992, *Nucleation Enhancement for Chemical Vapor Deposition of Diamond*, Stoner et al., allowed Mar. 28, 1994.

U.S. Patent Application Serial No. 08/035,643, filed Mar. 23, 1993, *Microelectronic Structure Having an Array of Diamond Structures on a Nondiamond Substrate and Associated Fabrication Methods*, Dreifus et al., pending.

Geis, *Growth of textured diamond films on foreign substrates from attached seed crystals*, Appl. Phys. Lett., 55:550–552 (1989).

Primary Examiner—A. A. Turner
Attorney, Agent, or Firm—Bell, Seltzer, Park & Gibson

[57] ABSTRACT

The highly-oriented diamond film is a diamond film formed by chemical vapor deposition, with at least 95% of its area consisting of either (100) or (111) crystal planes, and the differences $\{\Delta\alpha, \Delta\beta, \Delta\gamma\}$ of the Euler angles $\{\alpha, \beta, \gamma\}$ between the adjacent crystals satisfying ($|\Delta\alpha|\leq 1°$, $|\Delta\beta|\leq 1°$ and $|\Delta\gamma|\leq 1°$) simultaneously. Thus obtained highly-oriented diamond film has few grain boundaries and high carrier mobility. And the area of the diamond film can be large.

18 Claims, 3 Drawing Sheets

SURFACE STRUCTURE OF DIAMOND FILM
WITH HIGHLY ORIENTED (100) CRYSTAL PLANE

STANDARD ORIENTATION OF
CRYSTAL PLANE

SURFACE STRUCTURE OF DIAMOND FILM
WITH HIGHLY ORIENTED (100) CRYSTAL PLANE

HIGHLY-ORIENTED DIAMOND FILM

This is a continuation of application Ser. No. 08/062,005, filed on May 14, 1993, now abandoned.

BACKGROUND OF THE INVENTION

1. Field of the Invention

This invention relates to a highly-oriented diamond film wherein grain sizes are oriented in order unlike a polycrystalline diamond film wherein grain sizes are randomly oriented, and more particularly, to a highly oriented diamond film suited to applications as diamond semiconducting sensors, electronic devices, integrated circuits, electronic parts, optical parts and the like.

2. Prior Art References

Diamond is excellent in heat-resistance and heat conductivity, and its band gap is as big as about 5.4 eV. Diamond is an electrical insulator, and its dielectric breakdown voltage is, for instance, approximately more than thirty times as high as that of silicon.

The technique to synthesize diamond film by chemical vapor deposition is well known (Japanese Patent Publications Nos. 59-27754 and 61-3320).

In this method of synthesizing a diamond film, a mirror-like finished silicon substrate is mechanically polished using diamond paste or powder to make scratches thereon, and then placed in a flow of mixed gas of $CH_4+H_2$ containing about 1% methane to subject to microwave irradiation in this state to produce plasma around the substrate. By this process, diamond particles are deposited on the substrate to form a polycrystalline diamond film.

It is also known that a p-type semiconductor can be synthesized by doping boron (B) atoms (Japanese under Provisional Publication No. 59-137396). Furthermore, the technique has been disclosed by which electronic devices, such as diodes and transistors excellent in heat-resistance, are manufactured using semiconductor diamond films (K. Miyata, D. L. Dreifus, and K. Kobashi, Applied Physics Letters, Vol. 60, No. 4, p. 480 (1992) and A. J. Tessmer, K. Das and D. L. Dreifus, Diamond and Related Materials, Vol. 1, P. 89 (1992)).

It is also known that a single crystal diamond film can be synthesized by chemical vapor deposition on a single crystal diamond substrate, which is referred to as the homoepitaxial diamond film.

According to the methods described in Japanese Patent Publications Nos. 59-27754 and 61-3320, no other film than what we call a polycrystalline film, wherein diamond crystals are randomly oriented, can be synthesized on a substrate. Such a polycrystalline film presents some problems: the surface roughness of the polycrystalline film is as much as 0.1–0.5 μm: its electrical properties are inferior because of grain boundaries present among diamond crystals which scatter or trap carriers (electrons and holes).

Although a homoepitaxial diamond film formed on a single crystal diamond substrate offers no such problems, a commercially available single crystal diamond has a disadvantage that its area is usually smaller than 5 mm×5 mm, which is too small to be employed for the production of electronic and optical parts.

SUMMARY OF THE INVENTION

It is an object of the present invention to provide a highly-oriented diamond film with high carrier mobility (for electrons and holes) due to low density grain boundaries and with a large area.

The highly-oriented diamond film according to the present invention comprises a diamond film formed by chemical vapor deposition. At least 95% of its surface consists of either (100) or (111) crystal planes. Between the adjacent crystals, the differences $\{\Delta\alpha, \Delta\beta, \Delta\gamma\}$ of the Euler angles $\{\alpha, \beta, \gamma\}$, indicating the orientation of the crystal planes, satisfy $|\Delta\alpha|\leq 1°$, $|\Delta\beta|\leq 1°$ and $|\Delta\gamma|\leq 1°$ simultaneously.

According to this invention at least 95% of the highly oriented film surface area consists of either the (100) or (111) crystal planes, and between the adjacent crystals, the differences $\{\Delta\alpha, \Delta\beta, \Delta\gamma\}$ of the Euler angles $\{\alpha, \beta, \gamma\}$ satisfy $|\Delta\alpha|\leq 1°$, $|\Delta\beta|\leq 1°$ and $|\Delta\gamma|\leq 1°$ simultaneously. This invention therefore provides a diamond film which has a high carrier mobility approaching that of a homoepitaxial diamond film, is excellent in electrical properties because of low crystal defect density, and has a large surface area because it need not be formed on single crystals.

Because of the above characteristics, this diamond film is very effective for applications where heat-resistance is required, for instance, for semiconductor sensors, integrated circuits, and electronic and optical parts.

BRIEF DESCRIPTION OF THE DRAWINGS

FIG. 1A defines the standard orientation of a crystal surface, while FIG. 1B gives the surface structure of a diamond film wherein the (100) crystal plane is highly oriented:

DETAILED DESCRIPTION OF THE PREFERRED EMBODIMENTS

Figure 1A:
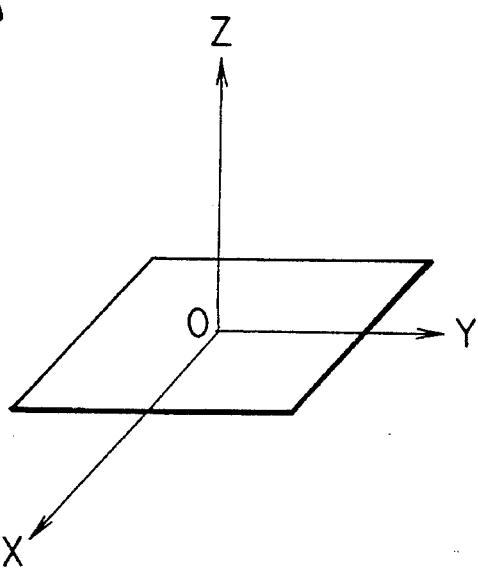
FIGS. 1A and 1B are diagrams giving the relationship between the surface of a highly-oriented diamond film and the Euler angles.
Figure 1B:
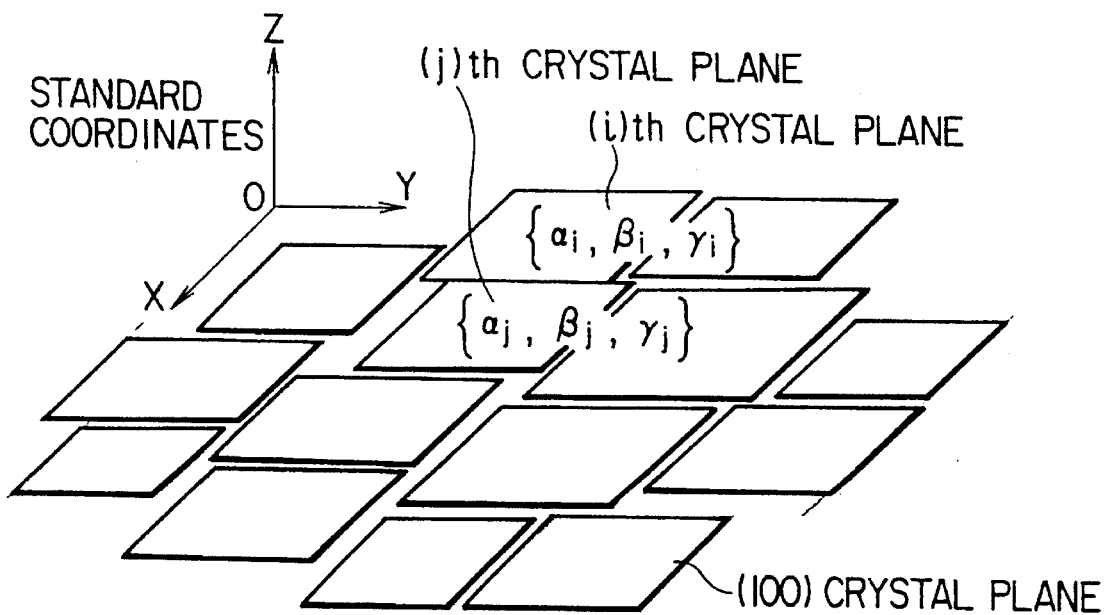

FIGS. 1A and 1B show diagrammatically the surface structure of a diamond film of the invention wherein the (100) crystal plane is highly oriented. FIG. 1A defines the x-axis and the y-axis which cross at right angles to each other in a film surface, also defining the normal direction of the film surface as the z-axis. As shown in FIG. 1B, the Euler angles indicating the orientation of crystal plane of the (i)th diamond crystal and the adjacent (j)th diamond crystal are denoted as $\{\alpha_i, \beta_i, \gamma_i\}$ and $\{\alpha_j, \beta_j, \gamma_j\}$ respectively, and the angle differences between the two as $\{\Delta\alpha, \Delta\beta, \Delta\gamma\}$.

The Euler angles $\{\alpha, \beta, \gamma\}$ indicate the orientation of the crystal plane that can be attained by rotating the standard crystal plane around the standard coordinates of axis z, y and z by the angles $\alpha$, $\beta$ and $\gamma$ one after another.

According to this invention, the highly oriented diamond film satisfies ($|\Delta\alpha|\leq 1°$, $|\Delta\beta|\leq 1°$ and $|\Delta\gamma|\leq 1°$) simultaneously. It therefore follows that the crystals are oriented to a high degree and that the carrier mobility is high similar to that of a homoepitaxial diamond film.

For the case of crystals with the (111) crystal plane as well, the crystals are highly oriented and the carrier mobility becomes high when all the absolute values of the differences in Euler angles are below 1°. Such a highly-oriented diamond film can be formed, for instance, by subjecting a silicon substrate to microwave radiation while applying a negative bias in the gas phase containing methane gas after the silicon substrate has been mirror-like finished.

According to this invention, at least 95% of the surface of the synthesized diamond film is covered with either (100) or (111) crystal planes.

Crystal planes of the same kind grow at the same rate. It therefore follows that if a diamond film is synthesized continuously for a prolonged period, the irregularity of the resulting film surface will either disappear or be significantly decreased as compared with that of a prior art polycrystalline diamond film. Again, if a film keeps growing, a gap between said crystal planes will become smaller and ultimately, the two adjacent crystals contact or overlap each other so that the film surface comes to be totally covered with the same kind of crystal plane.

Grain boundaries among diamond crystals are also present even in the highly-oriented diamond film as shown in FIG. 1B. The carrier scattering, however, is substantially reduced in comparison with that of prior art polycrystalline films because of the smaller angle differences among crystals resulting from the orientation of crystal planes to a high degree. Again, a reduction of the defect density existing along grain boundaries also results in a reduction of the carrier trapping. As is clear from the foregoing description, the highly-oriented diamond film according to the present invention has greatly improved electrical properties in comparison with prior art polycrystalline films.

The improvement in electrical properties as described above can be achieved by limiting the rate of coverage to the given conditions and limiting the absolute values of $\Delta\alpha$, $\Delta\beta$ and $\Delta\gamma$ to below the given values. These findings are based on the experimental data in Example 1 to be described later. A highly-oriented diamond film not meeting those conditions is inferior in electrical properties.

The highly-oriented diamond film according to this invention can be formed on silicon wafers, several inches in diameter; there is no limitation in surface area unlike a homoepitaxial diamond film. This provide a highly-oriented diamond film with a large surface area.

Furthermore, the highly-oriented diamond film according to the present invention is more than one hundred times higher than a prior art polycrystalline film in carrier mobility as evidenced by Examples 1 and 2 described later because of very little influence of grain boundaries on carrier scattering and trapping as above described. Thus electronic sensors, electronic devices, electronic integrated circuits, heat sinks, and surface acoustic wave elements can be produced whose electrical properties are much better than those using prior art polycrystalline films.

The highly-oriented diamond film can be used in various ways: it can be used as a highly-oriented diamond film formed on a substrate or as one without a substrate: it can also be used as a laminated film wherein a highly-oriented diamond layer doped with impurities and a intrinsic insulating layer are laminated together.

Some literature covering the synthesis of oriented diamond grains are available: for instance, B. R. Stoner and J. T. Glass, Applied Physics Letters, Vol. 60, No. 6, p. 698, 1992.

In the prior art, however, only as much as 50% of grains are oriented, with the rest random. This accounts for the poor electrical characteristics of the film produced by the prior art unlike the highly-oriented diamond film according to the present invention.

Examples of the present invention are described below in comparison with comparative examples.

EXAMPLE 1

Step 1

A silicon wafer, 1 inch in diameter, the (100) plane direction, was used as a substrate on which a highly-oriented diamond film was formed. This silicon substrate was put in a microwave chemical vapor deposition chamber and subjected to microwave irradiation for 15 minutes under the following conditions: 2% of methane, 98% of hydrogen, gas pressure at 25 Torr, gas flow rate at 300 cc/min, and substrate temperature at 650° C. The microwave input power was approximately 1000 W, but was adjusted slightly to keep the substrate temperature at 650° C. A negative bias was also applied to the substrate simultaneously. The current density by this negative bias was 10 mA/cm$^2$.

Step 2

The synthesis of a diamond film then followed for 80 hours under the following conditions: 0.5% of methane, 99.4% of hydrogen, 0.1% of oxygen, gas pressure at 30 Torr, gas flow rate at 300 cc/min, substrate temperature at 850° C. As a result, a highly oriented diamond film having a thickness of 20 µm thick was obtained.

Observation under an electron microscope revealed that 98% of the film surface was covered with the (100) crystal plane. The surface roughness was found to be less than 0.1 µm by the cross section photograph.

Furthermore, two electron-microscope photographs were taken at an angle of (±10°) from the normal direction of this film surface. In each photograph, the inclinations of the (100) crystal plane were measured: the differences in inclination between the adjacent crystals were ($|\Delta\alpha|\leq1°$, $|\Delta\beta|\leq1°$ and $|\Delta\gamma|\leq1°$) respectively, and ($|\Delta\alpha|^2+|\Delta\beta|^2+|\Delta\gamma|^2$) was 1.5.

Step 3

Further, a p-type semiconducting diamond film was laminated on this highly oriented film. The conditions of deposition were: 0.5% of methane, 99.5% of hydrogen, 0.1 ppm of diborane ($B_2H_6$), gas pressure at 30 Torr, gas flow rate at 300 cc/min, substrate temperature at 800° C., and process time for 7 hours. As a result, a laminate of the p-type semiconducting diamond film, 1.5 µm thick, whose surface structure was the same as that of the highly oriented film substrate was produced. The Hall mobility in this semiconducting diamond film was measured to be 115 cm$^2$/V.sec, which is more than one hundred times higher than that of a prior art polycrystalline diamond film.

Step 4

A similar experiment was carried out under the conditions of Steps 2 and 3 after the methane concentration and the substrate temperature in Step 1 had been changed as shown in Table 1 below:

TABLE 1

| Sample No. | Methane concentration (%) | Hydrogen concentration (%) | Substrate temperature (°C.) |
| --- | --- | --- | --- |
| 1 | 2 | 98.0 | 650 |
| 2 | 2.2 | 97.8 | 670 |
| 3 | 2.4 | 97.6 | 700 |
| 4 | 2.6 | 97.4 | 720 |

TABLE 1-continued

| Sample No. | Methane concentration (%) | Hydrogen concentration (%) | Substrate temperature (°C.) |
| --- | --- | --- | --- |
| 5 | 3.0 | 97.0 | 750 |

In sample No.2, 96% of the film surface was covered with the (100) crystal plane, and the rest 4% was a gap. ($|\Delta\alpha|\leq 1°$, $|\Delta\beta|\leq 1°$ and $|\Delta\gamma|\leq 1°$) was held for all adjacent crystals, and value of ($|\Delta\alpha|^2+|\Delta\beta|^2+|\Delta\gamma|^2$) was 2.4.

On the contrary, 92% and 90% of the film surfaces were covered with the (100) crystal plane in sample Nos. 4 and 5 respectively, and ($|\Delta\alpha|\geq 1°$, $|\Delta\beta|\geq 1°$ and $|\Delta\gamma|\geq 1°$) in all the adjacent crystals. The values of ($|\Delta\alpha|^2+|\Delta\beta|^2+|\Delta\gamma|^2$) were 6.8 and 12.0 in samples Nos. 4 and 5 respectively.

In sample No. 3, 95% of the film surface was covered with the (100) crystal plane, and the absolute values of ($\Delta\alpha$, $\Delta\beta$, $\Delta\gamma$) were either below 1° or above 1°. The value of ($|\Delta\alpha|^2+|\Delta\beta|^2+|\Delta\gamma|^2$) was 3.8. Accordingly, samples Nos. 1 and 2 are for the examples of this invention, while samples Nos. 3–5 are examples for comparison.

Figure 2:
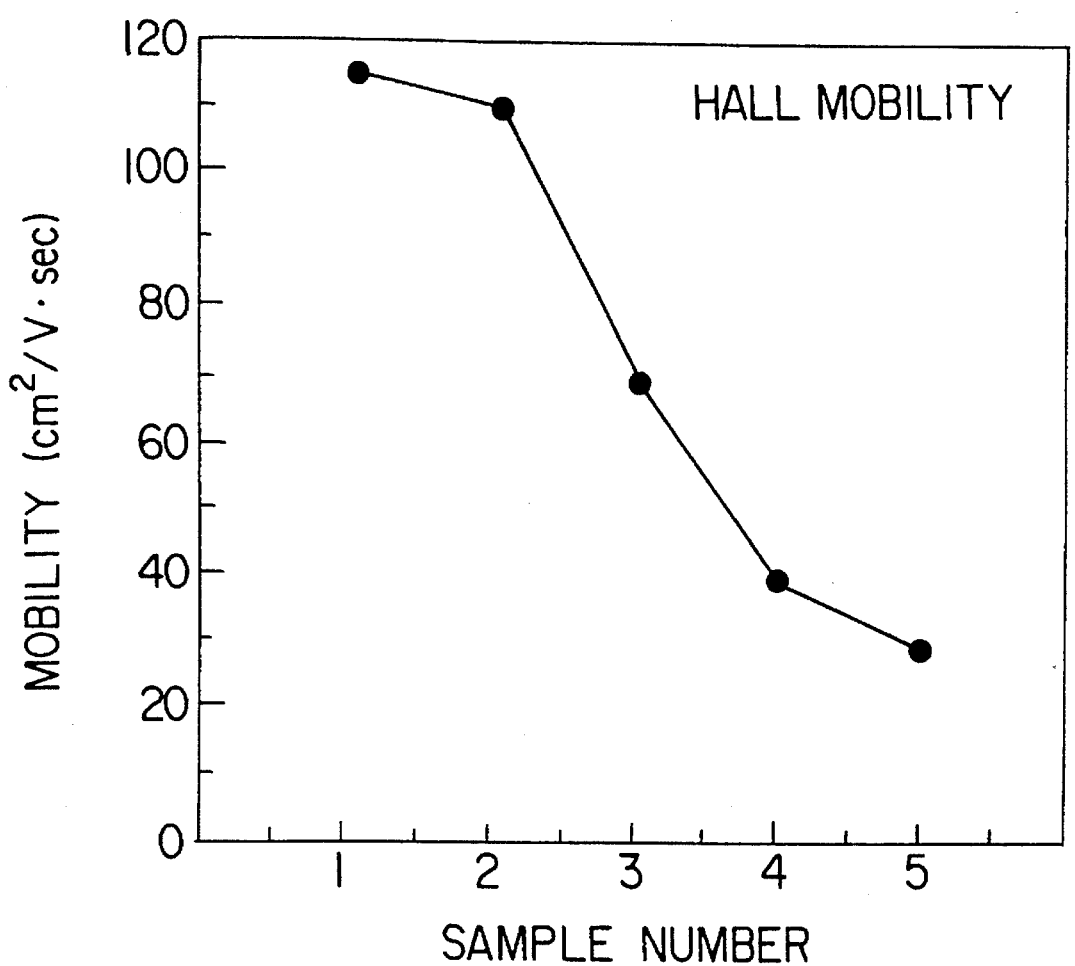
FIG. 2 is a graph showing the results of measurement of the Hall mobilities of each sample.

Next, the Hall mobility was measured for these samples Nos. 1–5. FIG. 2 shows the Hall mobilities obtained. As FIG. 2 shows, samples Nos. 1 and 2 differ greatly from samples Nos. 4 and 5 in Hall mobility. It may be concluded from this that the conditions set forth in Example 1 become necessary to produce a highly oriented film excellent in electrical properties.

EXAMPLE 2

In Step 2 of Example 1, a highly oriented diamond film was formed under the following conditions to carry out an deposition similar to that in Example 1: 0.5% of methane, 99.5% of hydrogen, 0.1 ppm of diborane ($B_2H_6$), gas pressure at 30 Torr, gas flow rate at 300 cc/min, substrate temperature at 800° C., process time for 80 hours. In this case, the findings were almost identical with those in Example 1 although the gas composition was different. It may be concluded from the findings that the p-type semiconducting highly oriented diamond film is also excellent in electrical properties if it falls within the range set forth by this invention.

EXAMPLE 3

Figure 3:
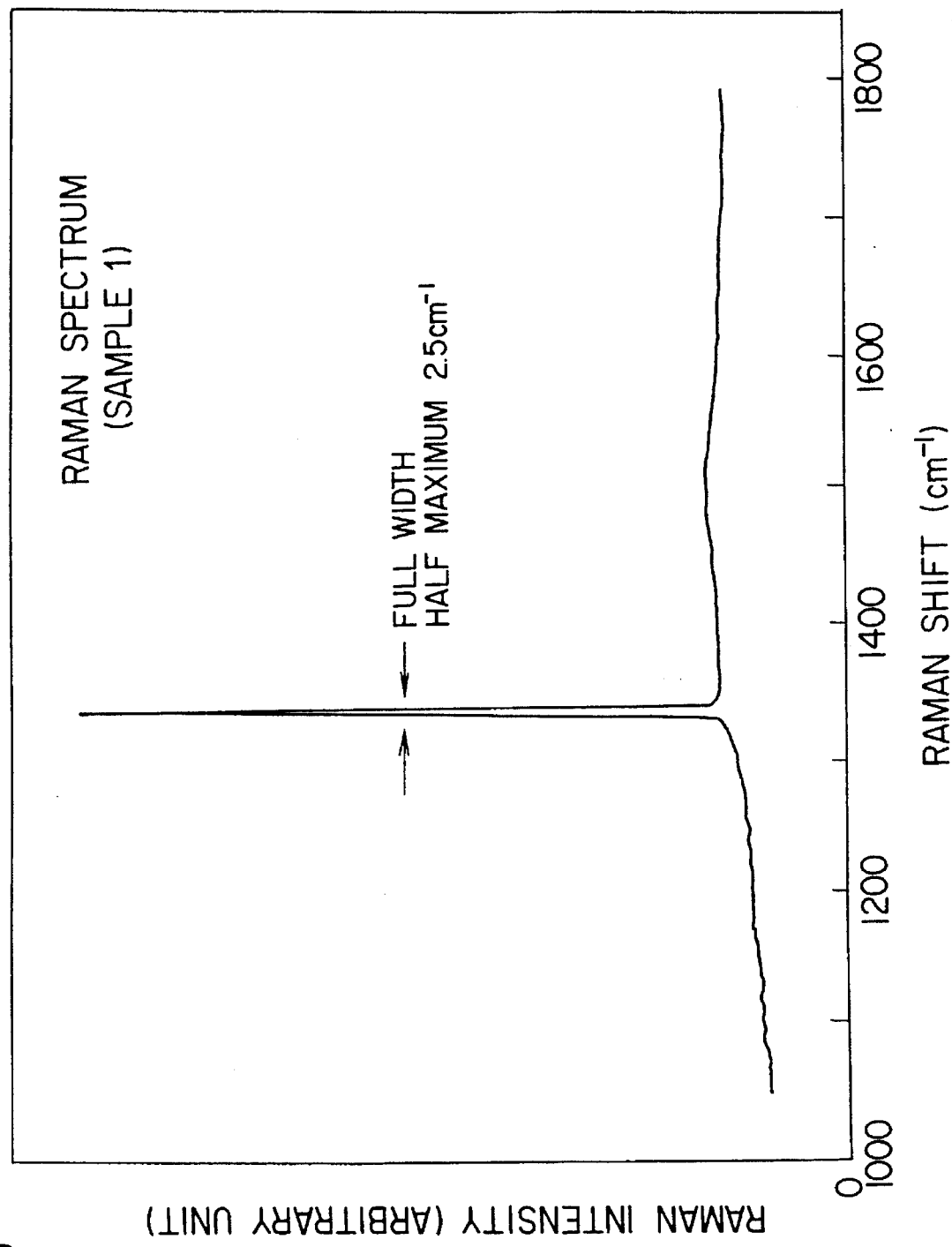
FIG. 3 is a graph giving the relationship between the Raman shift and the Raman intensity of sample 1.

FIG. 3 shows the Raman spectrum measured of sample No. 1 of Example 1. A sharp band of 1333 cm$^{-1}$ comes from diamond. It is known, however, that the finer the quality of diamond with few crystal defects, the narrower is this band width (Full Width at Half Maximum:FWHM). This FWHM is approximately 1.5 cm$^{-1}$ for high-quality natural diamond. In contrast, the FWHM of a prior art polycrystalline diamond film is 10–15 cm$^{-1}$. Table 2 below gives the findings of measurement of the Raman band width of the diamond film produced in Example 1. As Table 2 clearly shows, the highly-oriented diamond films (samples Nos. 1 and 2) according to this invention are also low in crystal defect density.

TABLE 2

| Sample No. | Full width at half maximum (FWHM) Units: cm$^{-1}$ |
| --- | --- |
| 1 | 2.5 |
| 2 | 2.7 |
| 3 | 3.5 |
| 4 | 4.3 |
| 5 | 4.5 |
| Natural single crystalline diamond | 1.2 |
| Prior art polycrystalline diamond film | 10–15 |

What is claimed is:

1. A highly-oriented diamond film formed by chemical vapor deposition, at least 95% of the surface area of said diamond film consisting of a plurality of diamond crystals with (100) crystal planes, and the differences {$\Delta\alpha$, $\Delta\beta$, $\Delta\tau$} of the Euler angles {$\alpha$, $\beta$, $\tau$}, indicating the orientations of the crystals, satisfying ($0\leq|\Delta\alpha|\leq 1°$, $0\leq\Delta\beta|\leq 1°$ and $0\leq\Delta\gamma|\leq 1°$) simultaneously between adjacent (100) crystal planes.

2. A highly-oriented diamond film formed by chemical vapor deposition, at least 95% of the surface area of said diamond film consisting of a plurality of diamond crystal with (111) crystal planes, and the differences {$\Delta\alpha$, $\Delta\beta$, $\Delta\tau$} of the Euler angles {$\alpha$, $\beta$, $\tau$}, indicating the orientations of the crystals, satisfying ($|\Delta\alpha|\leq 1°$. $|\Delta\beta|\leq 1°$ and $|\Delta\gamma|\leq 1°$) simultaneously between adjacent (111) crystal planes.

3. A highly-oriented diamond film according to claim 1, wherein said diamond film is formed on a non-diamond substrate.

4. A highly-oriented diamond film according to claim 2, wherein said diamond film is formed on a non-diamond substrate.

5. A highly-oriented diamond film according to claim 1, wherein said diamond film exists independently by removing mechanically or chemically said non-diamond substrate after said diamond film is formed on the non-diamond substrate.

6. A highly-oriented diamond film according to claim 2, wherein said diamond film exists independently by removing mechanically or chemically said non-diamond substrate after said diamond film is formed on the non-diamond substrate.

7. A highly-oriented diamond film according to claim 1, wherein said diamond film is doped with impurities so as to form a semiconducting diamond film.

8. A highly-oriented diamond film according to claim 2, wherein said diamond film is doped with impurities so as to form a semiconducting diamond film.

9. A highly-oriented diamond film according to claim 3, wherein said diamond film is doped with impurities so as to form a semiconducting diamond film.

10. A highly-oriented diamond film according to claim 4, wherein said diamond film is doped with impurities so as to form a semiconducting diamond film.

11. A highly-oriented diamond film according to claim 5, wherein said diamond film is doped with impurities so as to form a semiconducting diamond film.

12. A highly-oriented diamond film according to claim 6, wherein said diamond film is doped with impurities so as to form a semiconducting diamond film.

13. A highly-oriented diamond film according to claim 1, wherein said diamond film is formed of a laminate of a semiconducting layer doped with impurities and an intrinsic insulating layer.

14. A highly-oriented diamond film according to claim 2, wherein said diamond film is formed of a laminate of a semiconducting layer doped with impurities and an intrinsic insulating layer.

15. A highly-oriented diamond film according to claim 3, wherein said diamond film is formed of a laminate of a semiconducting layer doped with impurities and an intrinsic insulating layer.

16. A highly-oriented diamond film according to claim 4, wherein said diamond film is formed of a laminate of a semiconducting layer doped with impurities and an intrinsic insulating layer.

17. A highly-oriented diamond film according to claim 5, wherein said diamond film is formed of a laminate of a semiconducting layer doped with impurities and an intrinsic insulating layer.

18. A highly-oriented diamond film according to claim 6, wherein said diamond film is formed of a laminate of a semiconducting layer doped with impurities and an intrinsic insulating layer.

* * * * *